(12) United States Patent
Allen et al.

(10) Patent No.: US 6,404,278 B2
(45) Date of Patent: *Jun. 11, 2002

(54) SEPARATION OF PLURAL BAND PASS FILTERS

(75) Inventors: Justin L. Allen, Mesa; Samuel L. Thomasson, Gilbert, both of AZ (US)

(73) Assignee: Acoustic Technologies, Inc., Mesa, AZ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/482,293

(22) Filed: Jan. 13, 2000

(51) Int. Cl.[7] ................................................ H03K 5/00
(52) U.S. Cl. ..................................... 327/557; 327/552
(58) Field of Search ................................. 327/552, 553, 327/554, 555, 557, 47; 330/305, 303, 306

(56) References Cited

U.S. PATENT DOCUMENTS 3,727,147 A * 4/1973 DeWitt .......................... 330/84
5,349,254 A * 9/1994 Sakarya ........................ 327/47
5,805,716 A * 9/1998 Magg et al. .................. 381/98

OTHER PUBLICATIONS

"Electronic Filter Design Handbook," A.B. Williams and F.J. Taylor, 3rd Ed., McGraw–Hill, Inc. (1995), pp. 6.38–6.39.

* cited by examiner

Primary Examiner—Dinh T. Le
(74) Attorney, Agent, or Firm—Paul F. Wille

(57) ABSTRACT

The separation of a adjacent band pass filters is improved, without changing the filters, by inverting the output signals from alternate filters and not inverting the remaining output signals. All the output signals are then summed. The result is a deeper notch in the frequency response of adjacent filters.

7 Claims, 2 Drawing Sheets

SEPARATION OF PLURAL BAND PASS FILTERS

CROSS-REFERENCE TO RELATED APPLICATION

This application includes disclosure contained in application Ser. No. 09/466,313, filed Dec. 17, 1999, entitled "Band Pass Filter from Two Notch Filters", assigned to the assignee of this invention. The entire contents of the earlier application is incorporated herein by reference.

BACKGROUND OF THE INVENTION

This invention relates to band pass filters and, in particular, to improving the separation of parallel band pass filters without changing the filters themselves.

Frequently, a plurality of band pass filters are coupled in parallel and the outputs are summed at an active or passive summation node. As more fully described below, this has the effect of broadening the response curve of each filter in a pair of adjoining filters.

Parallel band pass filters are used in many and diverse applications, such as equalizers, hearing aids, telephones, and other audio and radio frequency applications. To consider but one example, a single telephone may include several sets of filters, e.g. for detecting multiple tone dialing signals, for noise reduction, and for echo cancellation. Devices known as complementary comb filters have been used to eliminate echoes by having the signal to a speaker filtered through the pass bands of a first comb filter, thereby falling within the stop bands of a second, complementary comb filter coupled to a microphone.

Comb filters are used primarily because the "Q" of most filters is relatively low, less than twenty and typically about ten. One definition of "Q" is the ratio of the bandwidth at −3 dB to the center frequency. The center frequencies in a comb filter are widely spaced, relative to the bandwidth, and band reject or stop band filters are used in between pairs of band pass filters. The "Q" of a filter is not a very good description of the frequency response of a filter because Q does not describe the shape of the response curve of the filter, particularly the "skirts" of the curve. It is desired that the skirts be as close to vertical as possible, although a vertical skirt can only be approached as a limit.

In view of the foregoing, it is therefore an object of the invention to improve the separation of parallel band pass filters without changing the filters themselves.

Another object of the invention is to reduce the bandwidth of parallel filters without affecting the nominal "Q" of the filter.

SUMMARY OF THE INVENTION

The foregoing objects are achieved in this invention in which the separation of a adjacent band pass filters is improved, without changing the filters, by inverting the output signals from alternate filters and not inverting the remaining output signals. All the output signals are then summed. The result is a deeper notch in the frequency response of adjacent filters.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
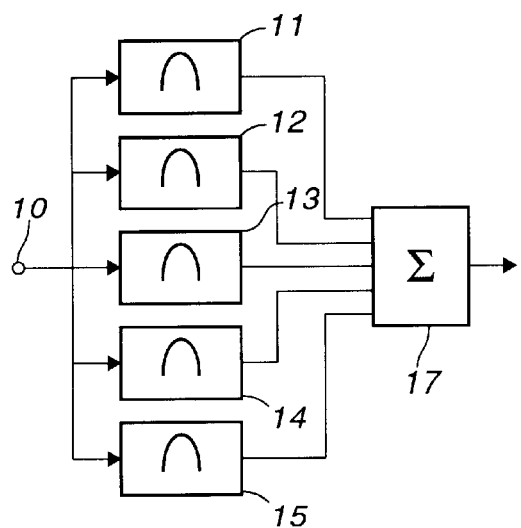
FIG. 1 is a block diagram of parallel band pass filters constructed in accordance with the prior art.

In FIG. 1, band pass filters 11, 12, 13, 14, and 15 have progressively higher center frequencies and are connected in parallel between input 10 and summation circuit 17. The center frequencies of the filters are typically geometrically related, e.g. each center frequency is 1.7 times the next lower center frequency, and the "Q" of the filters is typically ten. Other apparatus can be included in such circuitry, depending upon application. For example, an equalizer also includes a variable gain stage coupled to the output of each filter.

Figure 2:
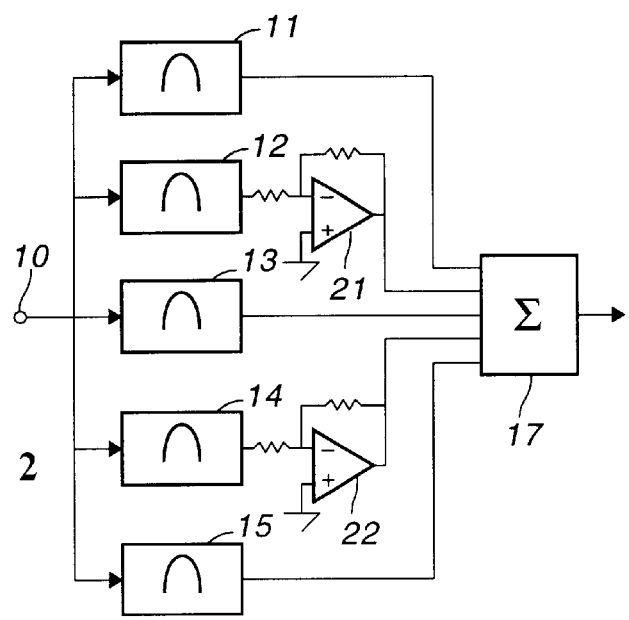
FIG. 2 is a block diagram of parallel band pass filters arranged in accordance with the invention.

FIG. 2 is a block diagram of an audio processing circuit constructed in accordance with the invention in which alternate filters are coupled through an inverting amplifier to the summation network. As illustrated in FIG. 2, the output of filter 12 is coupled through inverting amplifier 21 to summation circuit 17 and the output of filter 14 is coupled through inverting amplifier 22 to summation circuit 17. Either filters 11, 13, and 15 or filters 12 and 14 could have their outputs inverted. The effect of inverting alternate outputs is illustrated in FIG. 3.

Figure 3:
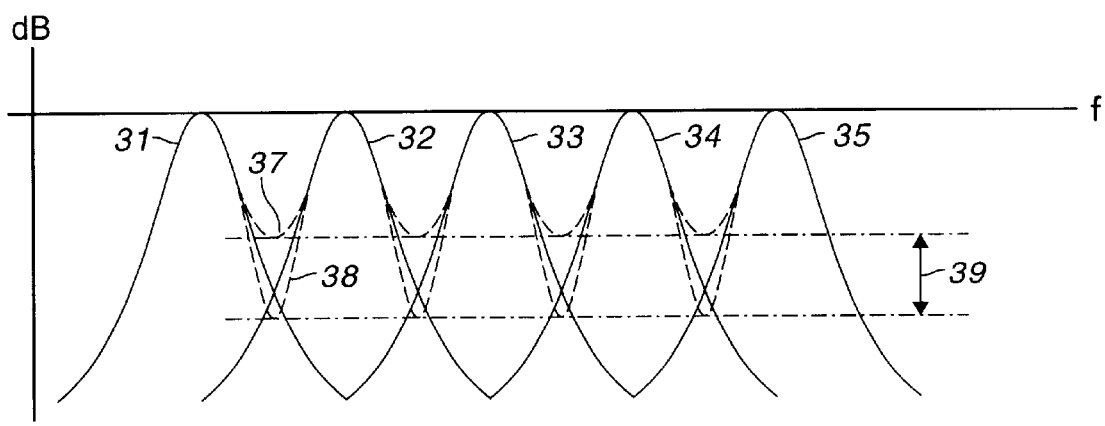
FIG. 3 is a chart of curves comparing the frequency responses of the circuits illustrated in FIGS. 1 and 2.

In FIG. 3, curve 31 represents the frequency response of filter 11, curve 32 represents the frequency response of filter 12, curve 33 represents the frequency response of filter 13, curve 34 represents the frequency response of filter 14, and curve 35 represents the frequency response of filter 15. The frequency responses of the filters overlap, although the point at which the response curves intersect may be far down on the curve. The response curves intersect approximately half-way between the center frequencies of the filters.

The sum of the outputs of filters 11 and 12 follows curve 37 in the region between the center frequencies. Note that the nadir of curve 37 is distinctly higher than the point at which curves 31 and 32 intersect. The outputs of the remaining filters combine to produce similar curves.

When alternate outputs are inverted in accordance with the invention, the sum of the outputs of filters 11 and 12 follows curve 38 in the region between the center frequencies. The difference, represented by double ended arrow 39, is approximately 8.5 dB in one embodiment of the invention. Not only is this a large additional attenuation between the bands but the skirts of the response curves are also steeper below approximately −10 dB.

Figure 4:
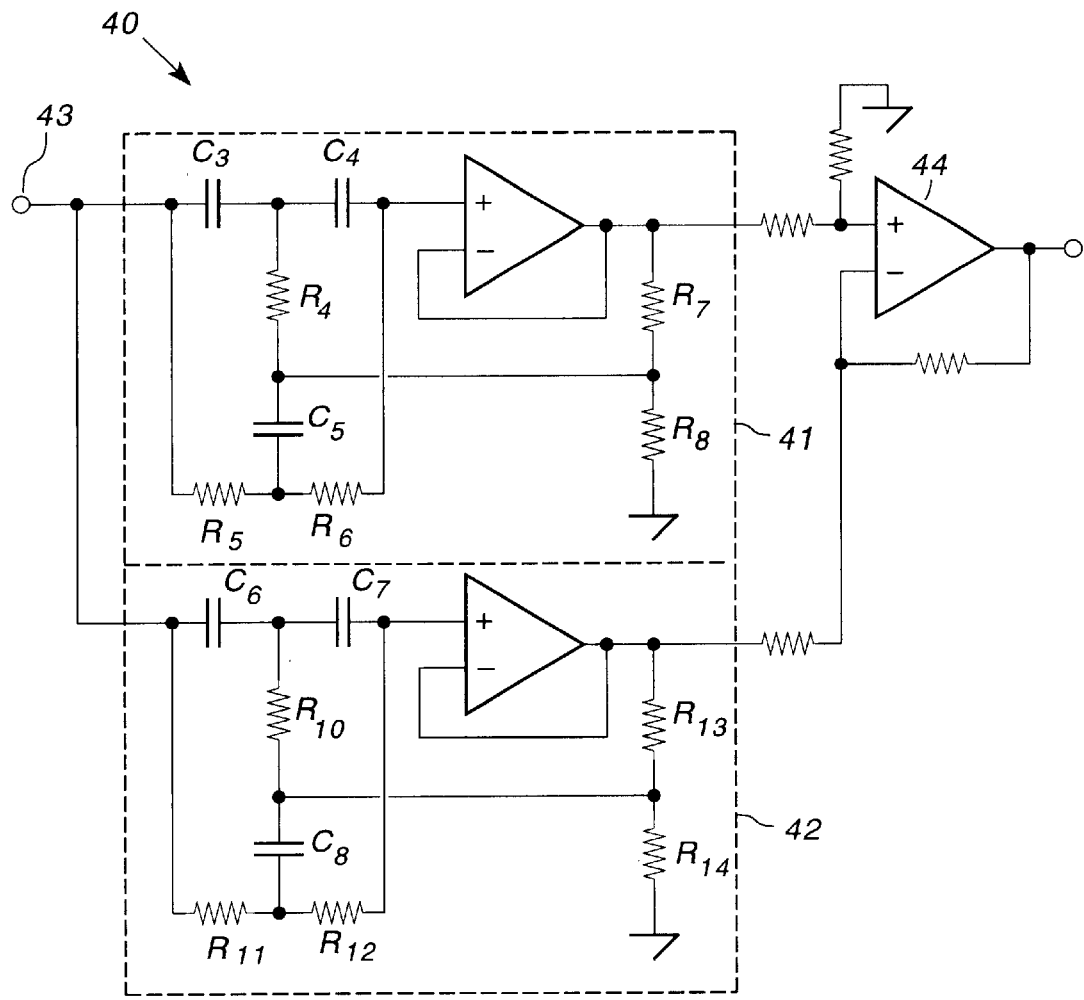
FIG. 4 is a schematic of a preferred embodiment of a band pass filter.

FIG. 4 is a schematic of a band pass filter incorporating the invention disclosed and claimed in the application cross-referenced above. Specifically, a preferred band pass filter is made by subtracting the outputs from two notch filters. The particular notch filter chosen is not critical. The notch filter illustrated in FIG. 4 is known as a twin-T filter with positive feedback; see "Electronic Filter Design Handbook" by Williams and Taylor, Third Edition, McGraw-Hill, Inc., 1995, pages 6.38 and 6.39. This particular filter was chosen because of its simplicity, depth of notch, and because the gain can be adjusted easily, by changing the ratio of resistors $R_7$ and $R_8$ or $R_{13}$ and $R_{14}$, to modify the frequency response of the resulting band pass filter. Band pass filter 40 includes two channels, 41 and 42, each containing a notch filter and each connected to input 43. The outputs of the channels are subtracted in amplifier 44.

Figure 5:
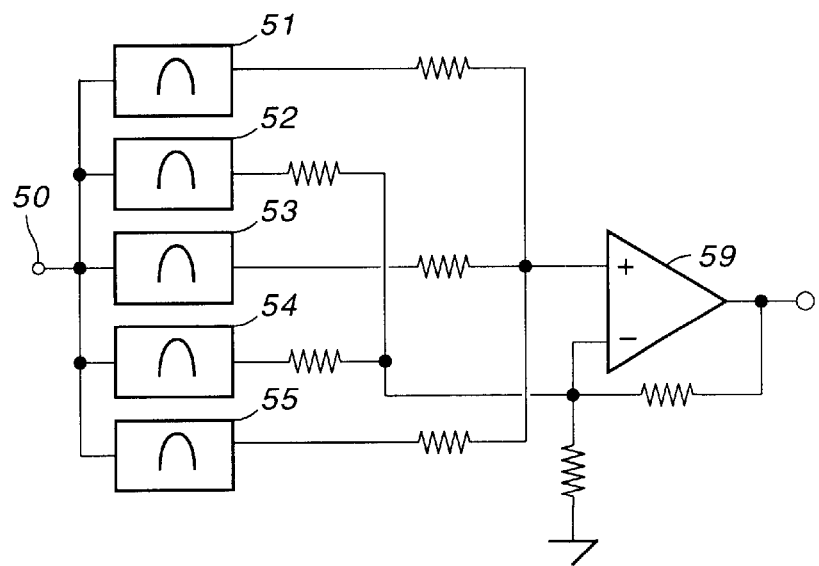
FIG. 5 is a partial block diagram of a preferred embodiment of the invention.

FIG. 5 is a partial schematic of a preferred embodiment of the invention including five filters such as filter 40 (FIG. 4) each having a different center frequency. In one embodiment of the invention, the center frequencies were 316 Hz, 534 Hz, 900 Hz, 1525 Hz, 2577 Hz, and the filters were one-third octave.

Input 50 is coupled to each of band pass filters 51, 52, 53, 54, and 55. The outputs of filters 51, 53, and 55 are coupled to the non-inverting input of operational amplifier 59, which preferably has unity gain. The outputs of filters 52 and 54 are coupled to the inverting input of amplifier 59. This is a simpler circuit than that illustrated in FIG. 2 but achieves the same result; namely, subtracting alternate bands from the remaining bands.

In operation, band pass filters constructed in accordance with FIG. 4 can have the skirts of the response curve individually adjusted and, in particular made steeper than obtainable with filters of the prior art. Even so, the circuit of FIG. 5 increases the depth of the notch between filters by approximately 8.5 dB, a significant improvement over filters of the prior art. Despite the increased depth between pass bands, a signal passing through two such filters, as in a telephone for example, showed 3 dB less attenuation than identical filters in which alternate pass bands were not inverted. In other words, the output signal was twice as loud with the invention as without the invention.

The invention thus reduces the bandwidth of parallel filters without affecting the nominal "Q" of the filter and provides improved separation of parallel band pass filters without changing the filters themselves. Thus, the invention can be used with any band pass filter.

Having thus described the invention, it will be apparent to those of skill in the art that various modifications can be made within the scope of the invention. For example, the invention can be used at any frequency and can be implemented in analog or digital form; e.g. with impedance elements as shown or as a finite impulse response (FIR) filter or as an infinite impulse response (IIR) filter. The inverting amplifier could precede the filter in alternate channels but this is not preferred. Depending upon the application and the number of filters, one may not invert the output of every other filter. For example, if fifteen band pass filters were used, one might invert the outputs of only filters five, seven, nine, and eleven or invert the outputs of only filters one, three, five and nine.

What is claimed as the invention is:

1. An audio processing circuit comprising:
   a common input;
   a plurality of band pass filters having progressively higher center frequencies;
   an amplifier having an inverting input, an output, and a non-inverting input;
   wherein alternate band pass filters are coupled between said common input and said non-inverting input and the remaining band pass filters are coupled between said common input and said inverting input.

2. The audio processing circuit as set forth in claim 1 wherein said band pass filters each include two notch filters and a difference amplifier.

3. The audio processing circuit as set forth in claim 2 wherein each notch filter includes a twin-T filter with positive feedback.

4. A method for improving the frequency separation of a plurality of band pass filters having progressively higher center frequencies, said method comprising the steps of:
   applying a first signal to the plurality of band pass filters to produce a plurality of output signals;
   inverting the output signal from alternate band pass filters, leaving the remaining output signals non-inverted; and
   combining the inverted output signals with the non-inverted output signals.

5. The method as set forth in claim 4 wherein said inverting step includes the step of:
   coupling the output signals from alternate band pass filters to an inverting input of an operational amplifier and coupling the remaining output signals to a non-inverting input of the operational amplifier.

6. A filter bank comprising:
   a common input;
   at least three band pass filters having progressively higher center frequencies;
   an amplifier having an inverting input, an output, and a non-inverting input;
   wherein at least one band pass filter is coupled between said common input and said inverting input and the remaining band pass filters are coupled between said common input and said non-inverting input; and
   wherein the output from the amplifier is a filtered signal.

7. The filter bank as set forth in claim 6 wherein there are at least five band pass filters, consecutively numbered, and the odd numbered filters are coupled between said common input and said non-inverting input and the even numbered band pass filters are coupled between said common input and said inverting input.

* * * * *